(12) United States Patent
Ali et al.

(10) Patent No.: US 10,687,426 B2
(45) Date of Patent: Jun. 16, 2020

(54) METHOD OF PRODUCING AN ELECTRICAL THROUGH CONNECTION BETWEEN OPPOSITE SURFACES OF A FLEXIBLE SUBSTRATE

(71) Applicant: Saralon GmbH, Chemnitz (DE)

(72) Inventors: Moazzam Ali, Chemnitz (DE); Björn Engler, Chemnitz (DE)

(73) Assignee: Saralon GmbH, Chemnitz (DE)

(*) Notice: Subject to any disclaimer, the term of this patent is extended or adjusted under 35 U.S.C. 154(b) by 0 days.

(21) Appl. No.: 16/692,636

(22) Filed: Nov. 22, 2019

(65) Prior Publication Data

US 2020/0100366 A1 Mar. 26, 2020

Related U.S. Application Data

(63) Continuation-in-part of application No. PCT/EP2018/025145, filed on May 25, 2018.

(30) Foreign Application Priority Data

May 25, 2017 (GB) .................................. 1708346.0

(51) Int. Cl.
*H05K 3/40* (2006.01)
*H05K 3/00* (2006.01)
*H05K 1/03* (2006.01)

(52) U.S. Cl.
CPC ........... *H05K 3/005* (2013.01); *H05K 1/0393* (2013.01); *H05K 3/4084* (2013.01); *H05K 2201/05* (2013.01); *H05K 2203/0221* (2013.01)

(58) Field of Classification Search
CPC .. H05K 3/4038; H05K 3/4053; H05K 3/4061; H05K 3/4069; H05K 3/4076; H05K 3/4084; H05K 3/4092
See application file for complete search history.

(56) References Cited

U.S. PATENT DOCUMENTS

| 3,969,815 | A | 7/1976 | Hacke et al. |
| 7,000,845 | B2 | 2/2006 | Welling et al. |
| 2006/0194031 | A1 | 8/2006 | Yamaguchi et al. |

FOREIGN PATENT DOCUMENTS

| EP | 2503862 A1 | 9/2012 |
| JP | 2011114287 A | 6/2011 |

*Primary Examiner* — Jeremy C Norris
(74) *Attorney, Agent, or Firm* — 24IP Law Group USA, PLLC; Timothy DeWitt

(57) ABSTRACT

A method of producing an electrical through connection. A cut extending from a first surface to a second surface and separating the area into a first part and a second part is provided on an area of the flexible substrate. At least one of the first and second part is raised from a first plane of the first surface. A first wet conductive layer is printed on the first surface on and around the cut. The first wet layer is solidified into a first dried conductive layer. At least one of the first part and the second part is raised from a second plane of the second surface. A second wet conductive layer is printed on the second surface on and around the cut. The second wet conductive layer is solidified into a second dried conductive layer, which creates an electrical through connection with the first dried conductive layer.

10 Claims, 5 Drawing Sheets

METHOD OF PRODUCING AN ELECTRICAL THROUGH CONNECTION BETWEEN OPPOSITE SURFACES OF A FLEXIBLE SUBSTRATE

CROSS-REFERENBCE TO RELATED APPLICATIONS

This application is a continuation-in-part of international patent application No. PCT/EP2018/025145 filed on May 15, 2018, which claims priority to UK Patent Application No. 170346.0 filed on May 25, 2017 entitled "Method of producing an electrical through connection between opposite surfaces of a flexible substrate". The content of both of the above-referenced applications is incorporated herein in its entirety.

BACKGROUND OF THE INVENTION

Field of the Invention

The present disclosure relates to a method to produce an electrical through connection from one surface of a flexible substrate to another surface by using a printing method.

Brief Description of the Related Art

In flexible electronics, electronic components are fixed on a flexible substrate e.g. paper, plastic, textile, or a laminate of different materials. Conducting traces are produced on a flexible substrate by printing a conducting ink or by etching out a metalized flexible substrate. It is always needed to electrically connect conducting traces of one surface of the flexible substrate to conducting traces of another surface. In prior-art different method have been used to produce electrical connections through flexible substrate, as mentioned in U.S. Pat. Nos. 3,969,815 A and 7,000,845 B2. A very common method of producing electrical connection is by first making a hole on the flexible substrate and then printing conductive inks on a first surface and then on a second surface. If the hole is big (>0.5 mm diameter) then ink flows through the hole and makes the printing plate dirty. Making such a small hole (<0.5 mm diameter) is very difficult by a typical die-cutting machine. Most of the printers have a die cutting machine which cannot make holes smaller than 2 mm diameter. Therefore, there is a need to have a method to produce an electrical through connection between opposite surfaces of a flexible substrate by using standard printing machines e.g. screen, offset, gravure, flexography, inkjet etc.

SUMMARY OF THE INVENTION

The present invention relates to a method of producing an electrical through connection between a first surface and a second surface of a flexible substrate. In the first step a cut is provided on an area of the flexible substrate. The cut extends from the first surface to the second surface and separates the area into at least a first part and a second part. In the next step, at least one of the first part and the second part is raised up from a first plane of the first surface. Then a first wet conductive layer is printed on the first surface, wherein the first wet conductive layer is on and around the cut. After that the wet layer is solidified into a first dried conductive layer. In the next step, at least one of the first part and the second part is raised up from a second plane of the second surface. After that a second wet conductive layer is printed on the second surface, wherein the second wet conductive layer is on and around the cut. Finally, the second wet conductive layer is solidified into a second dried conductive layer, which creates an electrical through connection.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

The invention will now be described in detail. Drawings and examples are provided for better illustration of the invention. It will be understood that the embodiments and aspects of the invention described herein are only examples and do not limit the protector's scope of the claims in any way. The invention is defined by the claims and their equivalents. It will be understood that features of one aspect or embodiment of the invention can be combined with the feature of a different aspect or aspects and/or embodiments of the invention.

Figure 1A:
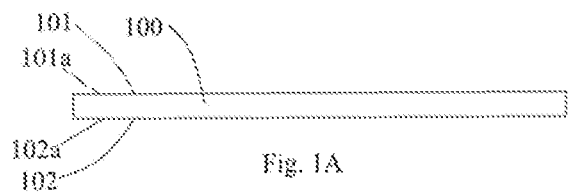
FIG. 1A is a cross sectional view of a flexible substrate.
Figure 1B:
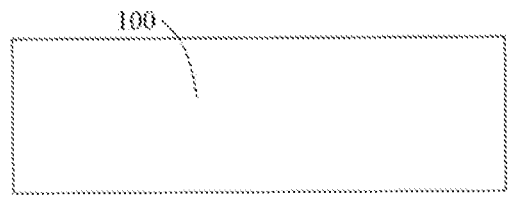
FIG. 1B is a top view of a flexible substrate.

The present invention relates to a method to produce an electrical through connection between two opposite surfaces of a flexible substrate. FIG. 1A shows a cross sectional view of the flexible substrate 100, comprising a first surface 101 and a second surface 102. The second surface 102 is opposite to the first surface 101. FIG. 1B shows a top view of the flexible substrate 100. The flexible substrate 100 is made of a mechanically flexible material. In a non-limiting aspect, the flexible substrate 100 is paper, plastic, textile, or a laminate of different materials. Non-limiting examples polyethylene terephthalate film, polyethylene naphthalate film, polyethylene film, polypropylene film, polycarbonate film and paper. The flexible substrate 100 can also be a laminate of at least two films mentioned above.

Figure 1C:
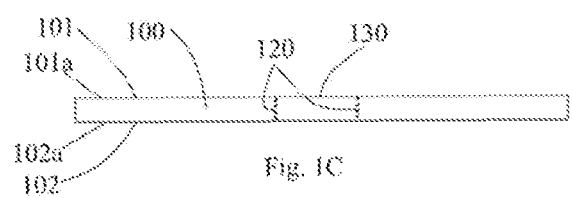
FIG. 1C is a cross sectional view of a flexible substrate with a cut.
Figure 1D:
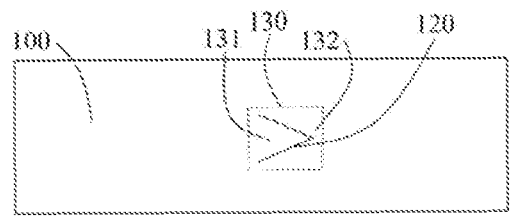
FIG. 1D is a top view of a flexible substrate with a cut.
Figure 1E:
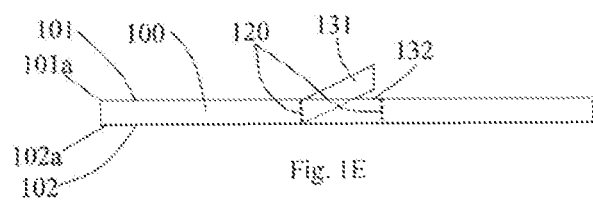
FIG. 1E is a cross sectional view of a flexible substrate with a raised first part.

The plane of the first surface 101 is termed as a first plane 101a. The plane of the second surface 102 is termed as a second plane 102a. If the flexible substrate 100 is placed on a horizontal surface, then the first plane 101a will be a horizontal plane parallel to the horizontal surface. Similarly, the second plane 102a will be a horizontal plane parallel to the horizontal surface. If the flexible substrate 100 is placed around a cylindrical roller then the first plane 101a will be a plane parallel to the surface of the roller. Similarly, the second plane 102a will be a plane parallel to the surface of the roller. A cut 120 is provided on an area 130 of the flexible substrate 100, as shown in FIG. 1C and FIG. 1D. Here, the cut is a V-shape and the cut separates the area 130 into two parts, a first part 131 and a second part 132, as shown in FIG. 1D. The cut can be of any shape and can separate the area 130 into multiples parts, as discussed later in FIG. 2. In the next step, at least one of the first part 131 and the second part 132 is raised up from the first plane 101a. In a non-limiting aspect, the first part 131 is raised, as shown in FIG. 1E. The first part 131 and/or the second part 132 can be raised by different ways, discussed later in FIG. 3A, FIG. 3B and FIG. 4.

Figure 1F:
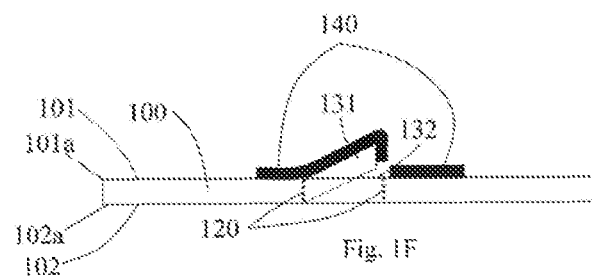
FIG. 1F is a cross sectional view of a flexible substrate with a first wet conductive layer.
Figure 1G:
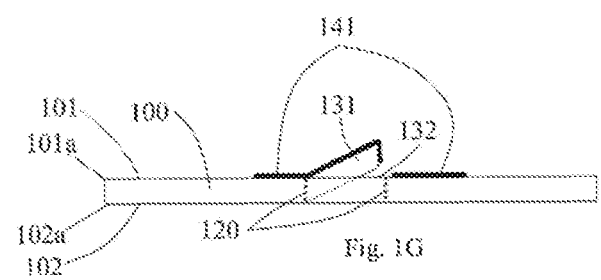
FIG. 1G is a cross sectional view of a flexible substrate with a first dried conductive layer.
Figure 1H:
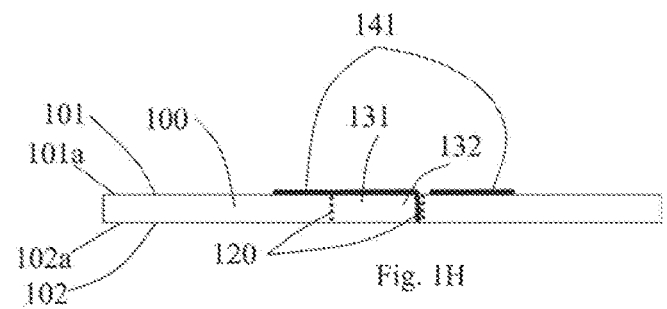
FIG. 1H is a cross sectional view of a flexible substrate.
Figure 1I:
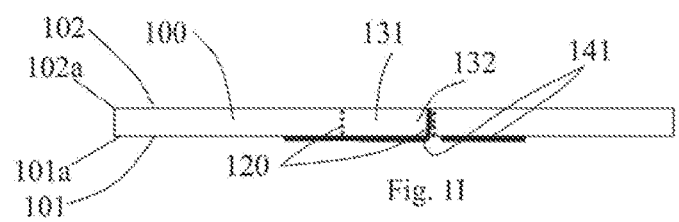
FIG. 1I is a cross sectional view of a flexible substrate turned upside down.
Figure 1J:
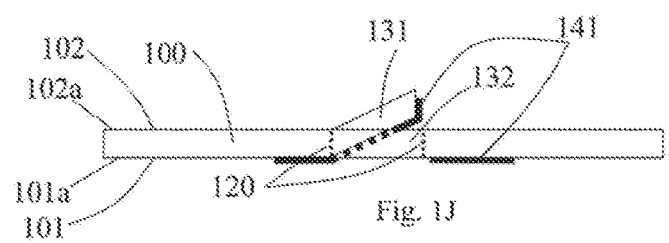
FIG. 1J is a cross sectional view of a flexible substrate with a raised first part.
Figure 1K:
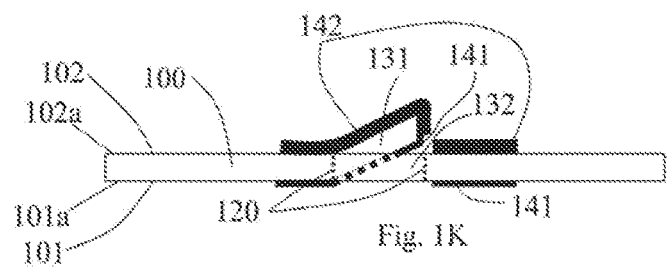
FIG. 1K is a cross sectional view of a flexible substrate with a second wet conductive layer.
Figure 1L:
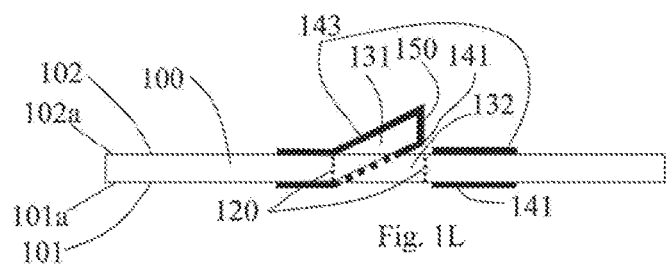
FIG. 1L is a cross sectional view of a flexible substrate with a second dried conductive layer.
Figure 1M:
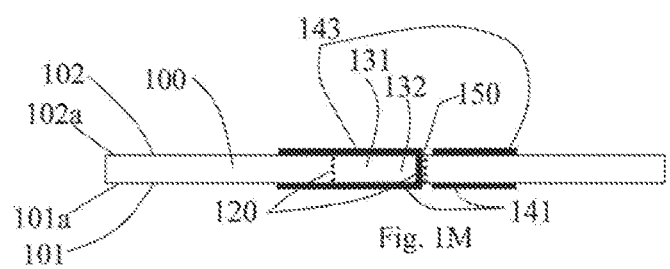
FIG. 1M is a cross sectional view of a flexible substrate with an electrical through connection.

In the next step, a conductive ink is printed on and around the cut 120 on the first surface 101a. The printed layer makes a wet layer of a first wet conductive layer 140, as shown in FIG. 1F. The first wet conductive layer 140 is dried or cured to a first dried conductive layer 141, as shown in FIG. 1G. FIG. 1H shows the flexible substrate 100 in which the first part 131 is brought back to its original position. FIG. 1I shows the flexible substrate 100 turned upside down, so that the top surface is now the second surface 102a. In the next step, at least one of the first part 131 and the second part 132 is raised up from the second plane 102a. Here, only the first part 131 is raised as shown in FIG. 1J. After that a second wet conductive layer 142 is printed on and around the cut on the second surface 102, as shown in FIG. 1K. After solidifying the second wet conductive ink 142 into a second dried conductive layer 143 an electrical connection 150 across the flexible substrate is established, as shown in FIG. 1L. FIG. 1M shows the flexible substrate 100, in which the first part 131 returned back to its original position. The conductive ink is, for example, DuPont 5028 silver conductive ink, but other conductive inks may be used. Different conductive inks are available in market by various suppliers with different types of conducting fillers in them. These fillers include but are not limited to silver, copper, silver-coated copper, zinc, nickel, iron, carbon black, graphene, graphite, carbon nanotube, conducting polymer like PEDOT:PSS.

Figure 2A:
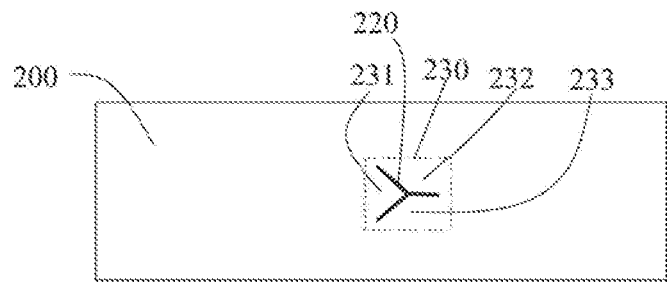
FIG. 2A is a top view of a flexible substrate with a Y shape cut.
Figure 2B:
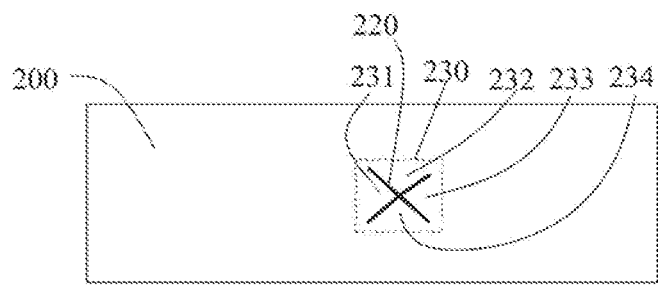
FIG. 2B is a top view of a flexible substrate with a X shape cut.
Figure 2C:
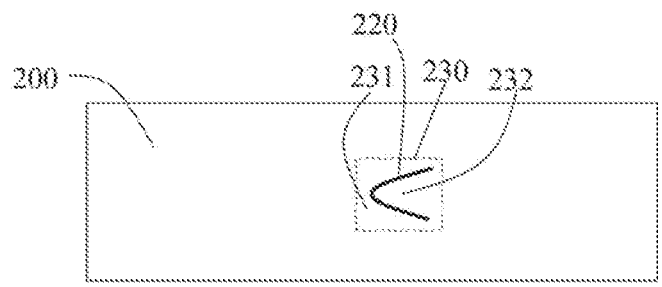
FIG. 2C is a top view of a flexible substrate with a U shape cut.
Figure 2D:
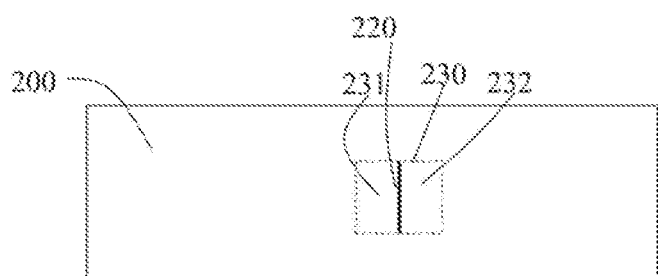
FIG. 2D is a top view of a flexible substrate with a straight-line shape cut.
Figure 2E:
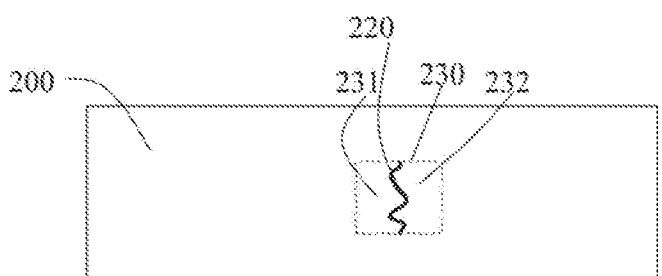
FIG. 2E is a top view of a flexible substrate with a zigzag shape cut.

The advantage of this method is that the printing plate does not get dirty due to the leakage of the conducting ink through a big hole. Any die cutting machine can make a cut easily, no special shape of cut is needed. FIG. 2A-2E show some shapes of the cut. It is noted here that FIG. 2A-2E show only few shapes, any other shape can also be possible. FIG. 2A shows a top view of the flexible substrate 200 comprising an area 230 and within that area is a Y-shape cut 220. The cut 220 separates the area 230 into three parts, a first part 231, a second part 232 and a third part 233. During the printing process of the conductive ink, any or all the parts can be raised up. FIG. 2B shows a top view of the flexible substrate 200 comprising an area 230 and within that area is a X-shape cut 220. The cut 220 separates the area 230 into four parts, a first part 231, a second part 232, a third part 233 and a fourth part 234. During the printing process of the conductive ink, any or all the parts can be raised up. FIG. 2C shows a top view of the flexible substrate 200 comprising an area 230 and within that area is a U-shape cut 220. The cut 220 separates the area 230 into two parts, a first part 231 and a second part 232. During the printing process of the conductive ink, any or all the parts can be raised up. FIG. 2D shows a top view of the flexible substrate 200 comprising an area 230 and within that area is a straight cut 220. The cut 220 separates the area 230 into two parts, a first part 231 and a second part 232. During the printing process of the conductive ink, any or all the parts can be raised. FIG. 2E shows a top view of the flexible substrate 200 comprising an area 230 and within that area is a zig-zag cut 220. The cut 220 separates the area 230 into two parts, a first part 231 and a second part 232. During the printing process of the conductive ink, any or all the parts can be raised up.

Figure 3A:
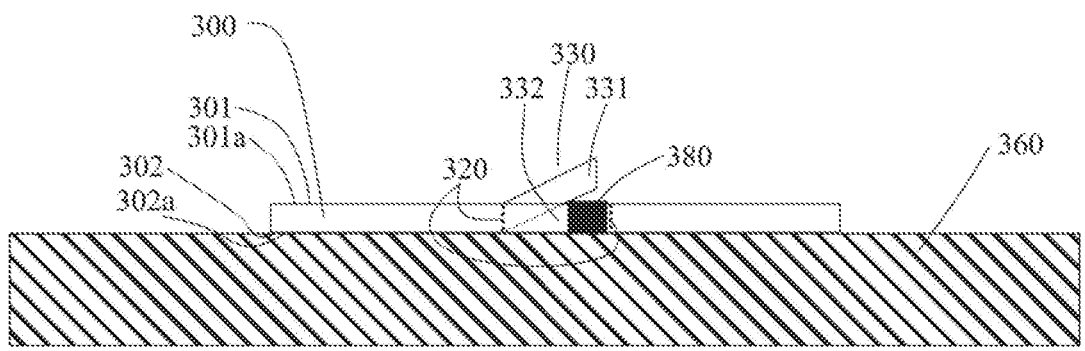
FIG. 3A is a cross sectional view of a flexible substrate on top of a flat-bed substrate holder of a printing machine.
Figure 3B:
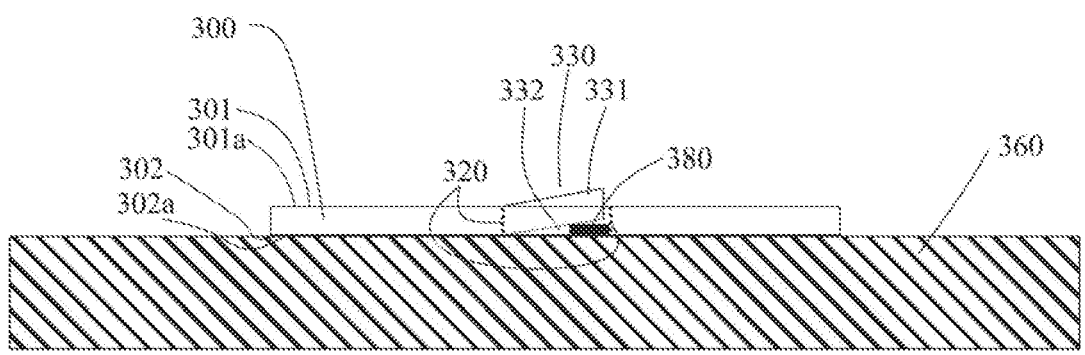
FIG. 3B is another cross-sectional view of a flexible substrate on top of a flat-bed substrate holder of a printing machine.

In a typical printing process, a flexible substrate is placed over a flat surface or over a cylindrical surface. FIG. 3A and FIG. 3B show cross sectional views of a flexible substrate 300, placed over a flat-bed substrate holder 360 of a printing machine. The flexible substrate 300 comprises a first surface 301 and a second surface 302. The second surface 302 is touching the flat-bed substrate holder 360. The first plane 301a of the first surface 301 is parallel to the horizontal plane of the substrate holder 360. The second plane 302a of the second surface 302 is parallel to the horizontal plane of the substrate holder 360. The cut 320 is provided on an area 330 of the flexible substrate 300. The cut 320 separates the area 330 into a first part 331 and a second part 332. The first part 331 is raised up from the horizontal plane 301a by using a push-up material 380. In a non-limiting example, the push-up material can be a piece of paper, metal or plastic. In a non-limiting aspect, the thickness of the push-up material 380 is equal to or more than the thickness of the flexible substrate 300, as shown in FIG. 3A. In another non-limiting aspect, the thickness of the push-up material 380 is less than the thickness of the flexible substrate 300, as shown in FIG. 3B. If the first part 331 is not raised enough, the electrical through connection can't be established through the cut 320. The push-up material 380 can have, without limiting the scope the invention, a similar shape like the cut 320. For example, if the cut 320 is V-shape then the push-up material 380 can also have a V-shape but smaller in dimension. The push-up material 380 can be fixed on the flat-bed substrate holder 360.

Figure 4:
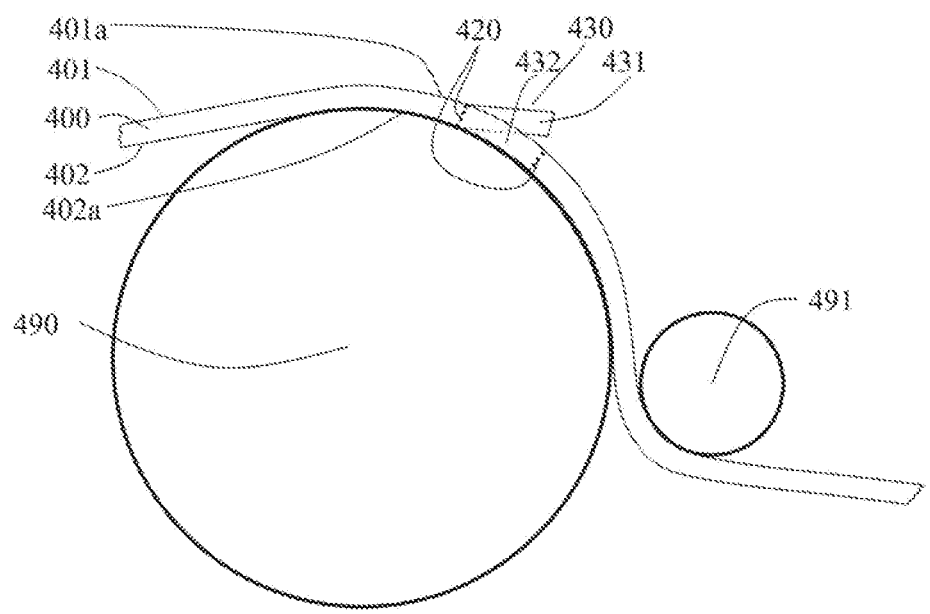
FIG. 4 is a cross sectional view of a flexible substrate on top of a cylindrical roller of a printing machine.

FIG. 4 shows a cross sectional view of a flexible substrate 400 around a cylindrical roller 490 and 491. The flexible substrate 400 comprises a first surface 401 and a second surface 402. The second surface 402 is touching a surface of the cylindrical roller 490. The cylindrical roller 490 can be a part of a printing machine. A first plane 401a of the first surface 401 is parallel to the cylindrical roller surface. The second plane 402a of the second surface 402 is parallel to the cylindrical roller surface too. The cut 420 is provided on an area 430 of the flexible substrate 400. The cut 420 separates the area 430 into a first part 431 and a second part 432. Another cylindrical roller 491 is also shown in FIG. 4 just for better understanding. The cylindrical roller 491 can be a part of a printing machine. Here, there is no need of using a push-up material. The first part 401 is automatically raised up from the first plane 401*a* due to the bending of the flexible substrate 400 around the cylindrical roller 490. Once the first part 431 is raised, a conductive ink can be printed on and around the cut 420.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method of producing an electrical through connection between a first surface and a second surface of a flexible substrate, comprising the steps of:
    providing a cut on an area of the flexible substrate, wherein the cut extends from the first surface to the second surface and separates the area into at least a first part and a second part;
    raising up at least one of the first part and the second part from a first plane of the first surface;
    printing a first wet conductive layer on the first surface, wherein the first wet conductive layer is on and around the cut;
    solidifying the first wet conductive layer into a first dried conductive layer;
    raising up at least one of the first part and the second part from a second plane of the second surface;
    printing a second wet conductive layer on the second surface, wherein the second wet conductive layer is on and around the cut; and
    solidifying the second wet conductive layer into a second dried conductive layer, wherein the first dried conductive layer and the second dried conductive layer create the electrical through connection.

2. The method of claim 1, wherein the flexible substrate is selected from a group of paper, plastic, textile and combinations thereof.

3. The method of claim 1, wherein the first plane and the second plane are horizontal.

4. The method of claim 1, wherein the first plane and the second plane are cylindrical.

5. The method of claim 1, wherein the printing steps of the first wet conductive layer and the second wet conductive layer are done by a flat-bed printing machine.

6. The method of claim 1, wherein the printing steps of the first wet conductive layer and the wet second conductive layer are done by a cylindrical roller printing machine.

7. The method of claim 1, wherein the cut is in a V-shape.

8. The method of claim 1, wherein at least one of the first part and the second part is raised up from one of the first plane and the second plane by bending the flexible substrate around a cylindrical roller of a printing machine.

9. The method of claim 1, wherein at least one of the first part and the second part is raised up from one of the first plane and the second plane by a push-up material, the push-up material is provided between the flexible substrate and a substrate holder of a printing machine.

10. The method of claim 9, wherein the thickness of the push-up material is less than or equal to the thickness of the flexible substrate.

\* \* \* \* \*